United States Patent
Yoshida

(10) Patent No.: US 10,320,281 B2
(45) Date of Patent: Jun. 11, 2019

(54) CONVERTER APPARATUS HAVING FUNCTION OF DETECTING FAILURE OF POWER DEVICE, AND METHOD FOR DETECTING FAILURE OF POWER DEVICE

(71) Applicant: FANUC CORPORATION, Minamitsuru-gun, Yamanashi (JP)

(72) Inventor: Tomokazu Yoshida, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/943,164

(22) Filed: Apr. 2, 2018

(65) Prior Publication Data
US 2018/0294711 A1    Oct. 11, 2018

(30) Foreign Application Priority Data

Apr. 7, 2017  (JP) ................. 2017-076983

(51) Int. Cl.
*H02M 1/32* (2007.01)
*H02M 7/219* (2006.01)
(Continued)

(52) U.S. Cl.
CPC ............. *H02M 1/32* (2013.01); *G01R 31/00* (2013.01); *H02H 9/00* (2013.01); *H02J 7/0052* (2013.01);
(Continued)

(58) Field of Classification Search
CPC ............. H02M 1/32; H02M 2001/322; H02M 2001/325; H02M 1/36; H02M 7/02;
(Continued)

(56) References Cited

U.S. PATENT DOCUMENTS 5,880,947 A * 3/1999 Imanaka ............. H02M 1/4233
363/127
9,559,580 B2    1/2017 Kuroki
(Continued)

FOREIGN PATENT DOCUMENTS

CN    105048927 A    11/2015
CN    105429548 A    3/2016
(Continued)

*Primary Examiner* — Alex Torres-Rivera
(74) *Attorney, Agent, or Firm* — RatnerPrestia

(57) ABSTRACT

A converter apparatus includes: a converter for converting an AC voltage into a DC voltage; a DC link capacitor connected to the converter; a voltage detector for DC link voltage; a charging circuit for the DC link capacitor; a charging circuit controller for a switch connected with a charging resistor; a current detector for detecting a current of the converter; a turn-on controller for controlling the turning-on of power devices; a switch for connecting or disconnecting a power supply; a power supply monitor for monitoring a connection state of the power supply; a threshold value setter for setting a first or second threshold value; and a failure detector for determining the presence or absence of the failure of the power devices by a comparison between a current flowing upon turning on the power device, immediately after disconnection of the power supply, and the first or second threshold value.

10 Claims, 4 Drawing Sheets

(51) Int. Cl.
- H02J 7/00 (2006.01)
- H02M 1/08 (2006.01)
- G01R 31/00 (2006.01)
- H02H 9/00 (2006.01)
- H02P 7/00 (2016.01)
- H02M 1/00 (2006.01)
- H02J 7/34 (2006.01)

(52) U.S. Cl.
CPC .............. H02M 1/08 (2013.01); H02M 7/219 (2013.01); H02P 7/00 (2013.01); *H02J 7/345* (2013.01); *H02M 2001/0009* (2013.01); *H02M 2001/0025* (2013.01)

(58) Field of Classification Search
CPC .......... H02M 7/04; H02M 7/12; H02M 7/125; H02M 7/162; H02M 7/1623; H02M 7/1626; H02M 7/21; H02M 7/217; H02M 7/2173; H02M 7/26
USPC ...... 363/50, 51, 52, 53, 54, 84, 87, 89, 127, 363/129
See application file for complete search history.

(56) References Cited

U.S. PATENT DOCUMENTS

| | | | |
|---|---|---|---|
| 9,787,084 B2 | 10/2017 | Yoshida | |
| 9,846,190 B2 | 12/2017 | Tateda et al. | |
| 2012/0087049 A1* | 4/2012 | Komatsu | H02H 7/1216 361/20 |
| 2013/0257301 A1* | 10/2013 | Tran | C01B 13/115 315/200 R |
| 2014/0153308 A1* | 6/2014 | Hart | H02M 1/32 363/129 |
| 2015/0346276 A1* | 12/2015 | Liu | H02M 7/487 324/750.3 |
| 2015/0365019 A1* | 12/2015 | Yamamoto | H02P 1/022 318/490 |
| 2016/0380571 A1* | 12/2016 | Yoshida | H02H 7/1216 318/504 |
| 2017/0373630 A1* | 12/2017 | Figie | H02P 29/024 |
| 2018/0267104 A1* | 9/2018 | Yang | G01R 31/327 |
| 2018/0269804 A1* | 9/2018 | Mizukami | H02M 5/293 |

FOREIGN PATENT DOCUMENTS

| | | |
|---|---|---|
| CN | 106301144 A | 1/2017 |
| JP | 08-080056 A | 3/1996 |
| JP | H09255255 A | 9/1997 |
| JP | H11332257 A | 11/1999 |
| JP | 2004357437 A | 12/2004 |

* cited by examiner

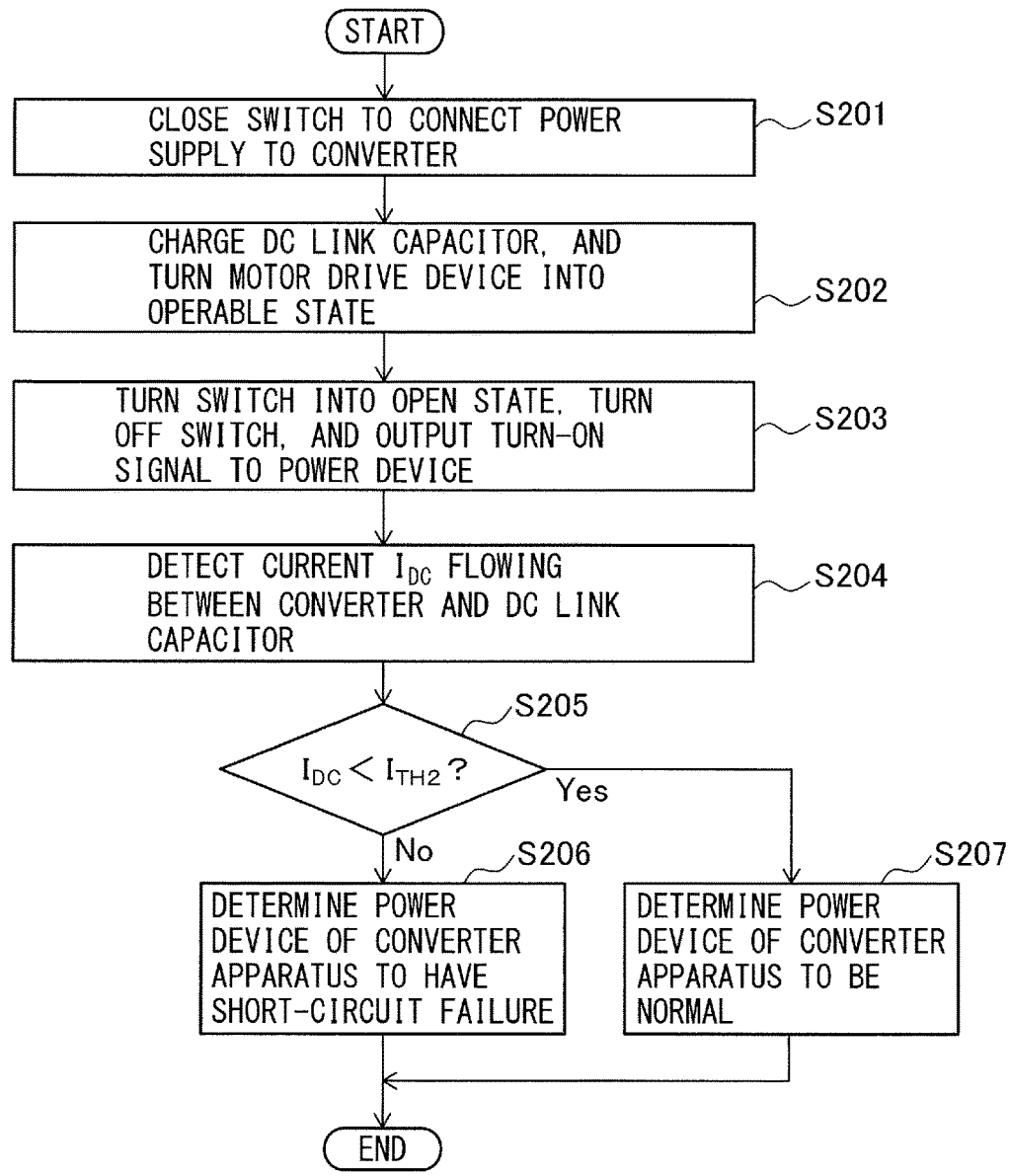

CONVERTER APPARATUS HAVING FUNCTION OF DETECTING FAILURE OF POWER DEVICE, AND METHOD FOR DETECTING FAILURE OF POWER DEVICE

This application is a new U.S. patent application that claims benefit of JP 2017-076983 filed on Apr. 7, 2017, the content of 2017-076983 is incorporated herein by reference.

BACKGROUND OF THE INVENTION

1. Field of the Invention

The present invention relates to a converter apparatus having a function of detecting a failure of a power device, and a method for detecting the failure of the power device.

2. Description of Related Art

As a method for driving a motor by a motor drive device, a method in which an AC voltage inputted from a main power supply is converted into a DC voltage by a converter having a power transistor (power device), and the DC voltage is converted into an AC voltage to drive the motor by an inverter is generally known. When there is an abnormality in the power transistor, supplying AC power from the main power supply to the power transistor may damage the motor drive device. Thus, before supplying the AC power from the main power supply to the converter, it is important to check the presence or absence of a failure of the power transistor.

Methods for detecting a failure of a power transistor of an inverter have been reported (for example, Japanese Unexamined Patent Publication (Kokai) No. H08-030056). In the conventional method for detecting a failure of a power transistor, an inverter includes current detectors the number of which is at least lower than the number of pairs of power transistors by 1, to detect the amounts of currents flowing through motor windings. In this method, before performing operation, the power transistors are turned on and off in specific orders and combinations in the state of applying a low voltage to the inverter including the power transistors. The current detectors detect currents flowing through the motor windings of individual phases. Whether there is a failure in the power transistors and which power transistor has the failure are detected based on the amounts of currents, the turn-on order, and the combinations.

SUMMARY OF THE INVENTION

However, in the case of a converter apparatus, inputting a turn-on signal into power devices in a powered state may cause a short circuit, and may damage the converter apparatus.

A converter apparatus according to an embodiment of this disclosure includes: a converter including a plurality of power devices, configured to convert an AC voltage supplied from a power supply into a DC voltage, and output the DC voltage; a DC link capacitor connected to an output side of the converter; a voltage detector configured to detect the voltage of the DC link capacitor; a charging circuit disposed between the converter and the DC lint capacitor, configured to charge the DC link capacitor; a charging circuit controller configured to control a switch connected in parallel with a charging resistor in the charging circuit; a current detector configured to detect a current flowing between the converter and the DC link capacitor; a turn-on controller configured to control the turning-on of the power devices of the converter; a switch configured to connect or disconnect between the power supply and the converter; a power supply monitor configured Lo control switching of the switch, and to monitor a connection state between the power supply and the converter by detecting a voltage to be inputted to the converter; a threshold value setter configured to set a first threshold value or a second threshold value to determine the presence or absence of a failure of the power devices; and a failure detector configured to determine the presence or absence of the failure of the power devices by a comparison between a current flowing upon turning on the power device of the converter using electric charge of the DC link capacitor, immediately after the switch disconnects the power supply from the converter and the switch is turned off, and the first threshold value or the second threshold value.

A method for detecting a failure of a power device according to the embodiment of this disclosure is a method for detecting a failure of a converter apparatus that includes: a converter including a plurality of power devices, configured to convert an AC voltage supplied from a power supply into a DC voltage, and output the DC voltage; a DC link capacitor connected to an output side of the converter; a current detector configured to detect a current flowing between the converter and the DC link capacitor; and a switch configured to connect or disconnect between the power supply and the converter. The method includes: connecting the power supply to the converter by closing the switch; charging the DC link capacitor; after the connecting step and the charging step, controlling the switch so as to turn the switch into an open state, to disconnect the power supply from the converter; detecting a current flowing between the converter and the DC link capacitor, immediately after the power supply is disconnected from the converter; and determining the presence or absence of a failure of the power devices, by a comparison between the detected current and a first threshold value or a second threshold value.

BRIEF DESCRIPTION OF THE DRAWINGS

The objects, features, and advantages of the present invention will be more apparent from the following description of a preferred embodiment relating to the accompanying drawings. In the drawings.

FIG. 4 is a flowchart of a short-circuit failure detection process by a method for detecting a failure of the converter apparatus according to a modification example of the embodiment.

DETAILED DESCRIPTION OF THE INVENTION

A converter apparatus having the function of detecting a failure of a power device and a method for detecting the failure in the power device according to the present invention will be described below with reference to the drawings. However, the technical scope of the present invention is not limited to its embodiment, but encompasses the invention described in claims and equivalents thereof.

Figure 1:
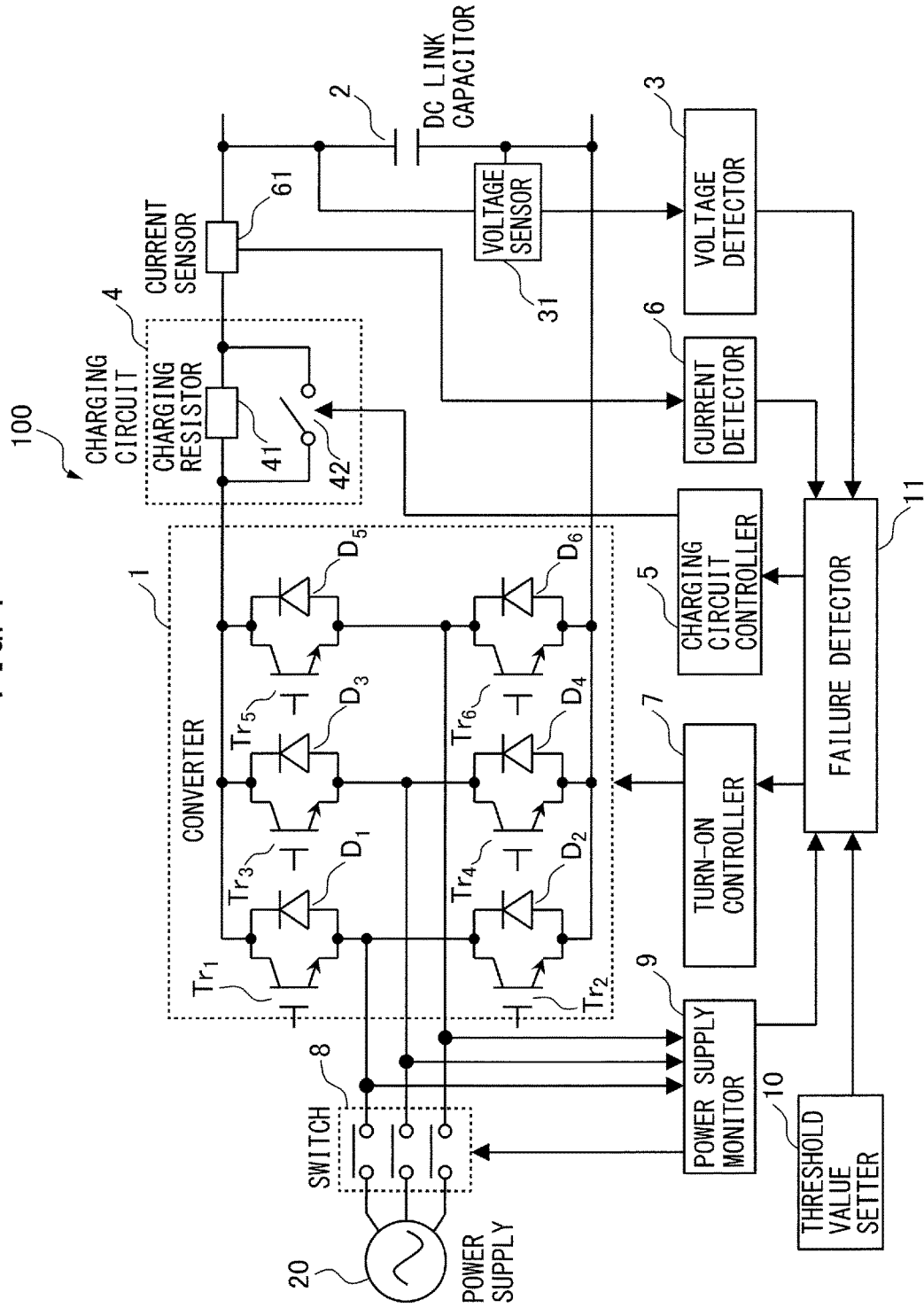
FIG. 1 is a block diagram of a converter apparatus according to the embodiment.

A converter apparatus having the function of detecting a failure of a power device according to an embodiment of this disclosure will be described. FIG. 1 is a block diagram of a converter apparatus according to the embodiment. A converter apparatus 100 includes a DC link capacitor 2, a voltage detector 3, a charging circuit 4, a charging circuit controller 5, a current detector 6, a turn-on controller 7, a switch 8, a power supply monitor 9, a threshold value setter 10, and a failure detector 11.

The converter 1 includes a plurality of (for example, six) power devices ($Tr_1$ to $Tr_6$). The converter 1 selectively switches (turns on) the power devices ($Tr_1$ to $Tr_6$, so as to convert an AC voltage supplied from a power supply 20 into a DC voltage to be outputted, and so as to perform a power regenerative operation. As shown in FIG. 1, a plurality of (for example, six) diodes ($D_1$ to $D_6$) are preferably connected in an anti-parallel manner to the power devices ($Tr_1$ to $Tr_6$). As the power devices ($Tr_1$ to $Tr_6$), transistors, FETs, IGBTs, etc., can be used.

The DC link capacitor 2 is connected to the output side of the converter 1. The DC link capacitor 2 smooths the DC voltage outputted from the converter 1. The smoothed DC voltage is supplied to a motor drive device (not shown).

The voltage detector 3 detects the voltage of the DC link capacitor 2. More specifically, a voltage sensor 31 connected between both terminals of the DC link capacitor 2 detects the voltage across the DC link capacitor 2, and sends a detection result to the voltage detector 3. The voltage of the DC link capacitor 2 obtained by the voltage detector 3 is outputted to the failure detector 11.

The charging circuit 4, which is disposed between the converter 1 and the DC link capacitor 2, charges the DC link capacitor 2. When the DC link capacitor 2 is charged, a switch 42 of the charging circuit 4 is turned off. Therefore, the DC link capacitor 2 is charged through a charging resistor 41, while preventing a large inrush current into the DC link capacitor 2.

The charging circuit controller 5 controls the switch 42 connected in parallel with the charging resistor 41 in the charging circuit 4. As described above, when the DC link capacitor 2 is charged, the charging circuit controller 5 turns off the switch 42. Upon completion of charging of the DC link capacitor 2, the charging circuit controller 5 turns on the switch 42. When a failure is detected in the power devices, as described later, the charging circuit controller 5 turns off the switch 42 so that an excessive current does not flow through the power devices.

The current detector 6 detects a current flowing between the converter 1 and the DC link capacitor 2. More specifically, a current sensor 61 is provided between the converter 1 and the DC link capacitor 2, and the current value detected by the current sensor 61 is sent to the current detector 6. The current value obtained by the current detector 6 is outputted to the failure detector 11.

The turn-on controller 7 controls the turning-on of the power devices ($Tr_1$ to $Tr_6$) of the converter 1. The converter 1 selectively turns on the power devices ($Tr_1$ to $Tr_6$) in accordance with a signal from the turn-on controller 7, in order to convert an AC voltage supplied from the power supply 20 into a DC voltage to be outputted, and to perform a power regenerative operation.

The switch 8 connects or disconnects between the power supply 20 and the converter 1. The switch 8 includes three switches each of which corresponds to each phase of the power supply 20, i.e., a three-phase AC power supply. FIG. 1 shows an example of using the three-phase AC power supply as the power supply 20. However, the power supply is not limited to a three-phase AC power supply, but may be a single-phase AC power supply.

The power supply monitor 9 controls the switching of the switch 8, while detecting a voltage to be inputted to the converter 1 in order to monitor the connection state between the power supply 20 and the converter 1. The failure detector 11 is notified of the contents of the switching control of the switch 8 by the power supply monitor 9. As the switch 8, an electromagnetic contactor, etc., can be used.

By closing the switch 8 (turning the switch 8 into a closed state), the power supply 20 is connected to the converter 1, so that an AC voltage is suppled to the converter 1. At this time, the converter 1 converts the AC voltage into a DC voltage. The DC voltage is applied to the DC link capacitor 2, and charges the DC link capacitor 2.

By opening the switch 8 (turning the switch 8 into an open state), the converter 1 is disconnected from the power supply 20. Electric charge accumulated in the DC link capacitor 2 is discharged.

The threshold value setter 10 sets a first threshold value $I_{TH1}$ and a second threshold value $I_{TH2}$ to determine the presence or absence of a failure in the power devices ($Tr_1$ to $Tr_6$). The first threshold value $I_{TH1}$ is a threshold value to detect an open-circuit failure of the power devices ($Tr_1$ to $Tr_6$). The second threshold value $I_{TH2}$ is a threshold value to detect a short-circuit failure of the power devices ($Tr_1$ to $Tr_6$). The threshold value setter 10 can rewrite the first threshold value $I_{TH1}$ and the second threshold value $I_{TH1}$ in accordance with a signal inputted from outside. The rewritable threshold values bring about the advantage that failure detection can be performed in accordance with use conditions.

The failure detector 11 compares a current flowing upon turning on power devices of the converter 1 using electric charge of the DC link capacitor 2, immediately after the switch 8 disconnects the power supply 20 from the converter 1 and the switch 42 is turned off, with the first threshold value $I_{TH1}$ and the second threshold value $I_{TH2}$, in order to determine the presence or absence of a failure of the power devices.

Figure 2:
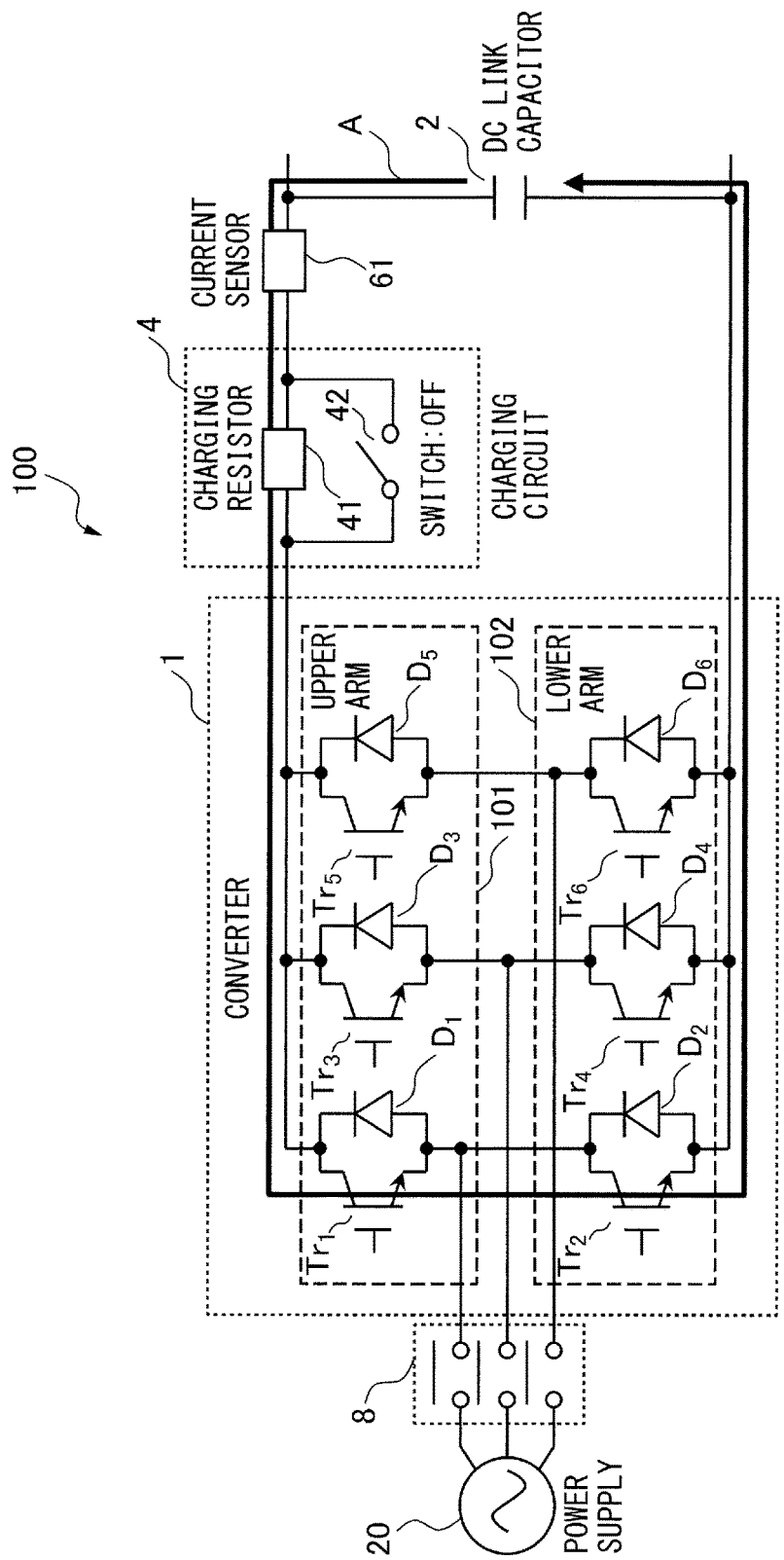
FIG. 2 is a drawing showing an example of a current path, when performing failure detection, in the converter apparatus according to the embodiment.

FIG. 2 shows an example of a current path when performing failure detection in the converter apparatus according to the embodiment. As shown in FIG. 2, the power devices are turned on using electric charge accumulated in the DC link capacitor 2, immediately after the power supply 20 is disconnected from the converter 1, and a failure of the power devices is detected from the flowing current. Out of the six power devices ($Tr_1$ to $Tr_6$) of the converter 1, the power devices $Tr_1$, $Tr_3$, and $Tr_5$ are power devices for an upper arm 101, and the power devices $Tr_2$, $Tr_4$, and $Tr_6$ are power devices for a lower arm 102. Furthermore, in the case of a three-phase AC circuit, the power devices $Tr_1$ and $Tr_2$ may be U-phase power devices, the power devices $Tr_3$ and $Tr_4$ may be V-phase power devices, and the power devices $Tr_5$ and $Tr_6$ may be W-phase power devices. As shown in FIG. 2, the upper arm power device $Tr_1$ and the lower arm power device $Tr_2$ of the same phase, e.g., the U-phase, are concurrently turned on, and the presence or absence of an open-circuit failure of the power devices is determined from the flowing current. For example, when a current flows as indicated by the arrow A of FIG. 2, the converter apparatus 100 is determined to be normal. On the other hand, when a current detected by the current sensor 61 is equal to or less than the first threshold value $I_{TH1}$, the converter apparatus 100 is determined to have an open-circuit failure.

When the turn-on controller 7 turns on the power devices, the charging circuit controller 5 preferably controls the charging circuit 4 such that an excessive current does not flow through the power devices. In other words, failure detection is performed on the power devices by turning on the DC link capacitor 2 and the power devices ($Tr_1$ to $Tr_6$) of the upper and lower arms (101 and 102), immediately after the power supply 20 is disconnected from the converter 1. At this time, the switch 42 of the charging circuit 4 is preferably turned off to limit the current flowing through the power devices. This is because, when no element to limit current is provided, the DC link capacitor 2 simply shorts out across both terminals, and the short circuit may cause damage to the power devices ($Tr_1$ to $Tr_6$).

Furthermore, in accordance with the current flowing upon turning on a power device (e.g., $Tr_1$) of any one of the upper arm 101 and the lower arm 102 of the converter 1, the failure detector 11 can detect the presence or absence of a short-circuit failure in another power device (e.g., $Tr_2$) of the other of the upper arm 101 and the lower arm 102. In the example of FIG. 2, $Tr_1$ is turned on, while $Tr_2$ is turned off. When $Tr_2$ operates normally, no current flows through $Tr_2$, so the current sensor 61 detects no current. On the other hand, when the current sensor 61 detects a current I of a specific amount or more ($>I_{TH2}$), though $Tr_2$ is turned off, $Tr_2$ is determined to have a short-circuit failure.

As described above, the converter apparatus according to this embodiment can determine the presence or absence of an open-circuit failure and a short-circuit failure of the power devices, based on the current flowing upon turning on the power devices or element using electric charge accumulated in the DC link capacitor, immediately after the power supply is disconnected from the converter.

When an open-circuit failure or a short-circuit failure of the power devices is detected, the failure detector 11 may issue a notification about the occurrence of an abnormality, using a lamp, an alarm signal, etc. Since the operator is thereby notified of the occurrence of the abnormality of the power devices, the converter apparatus is prevented from being repowered.

Figure 3:
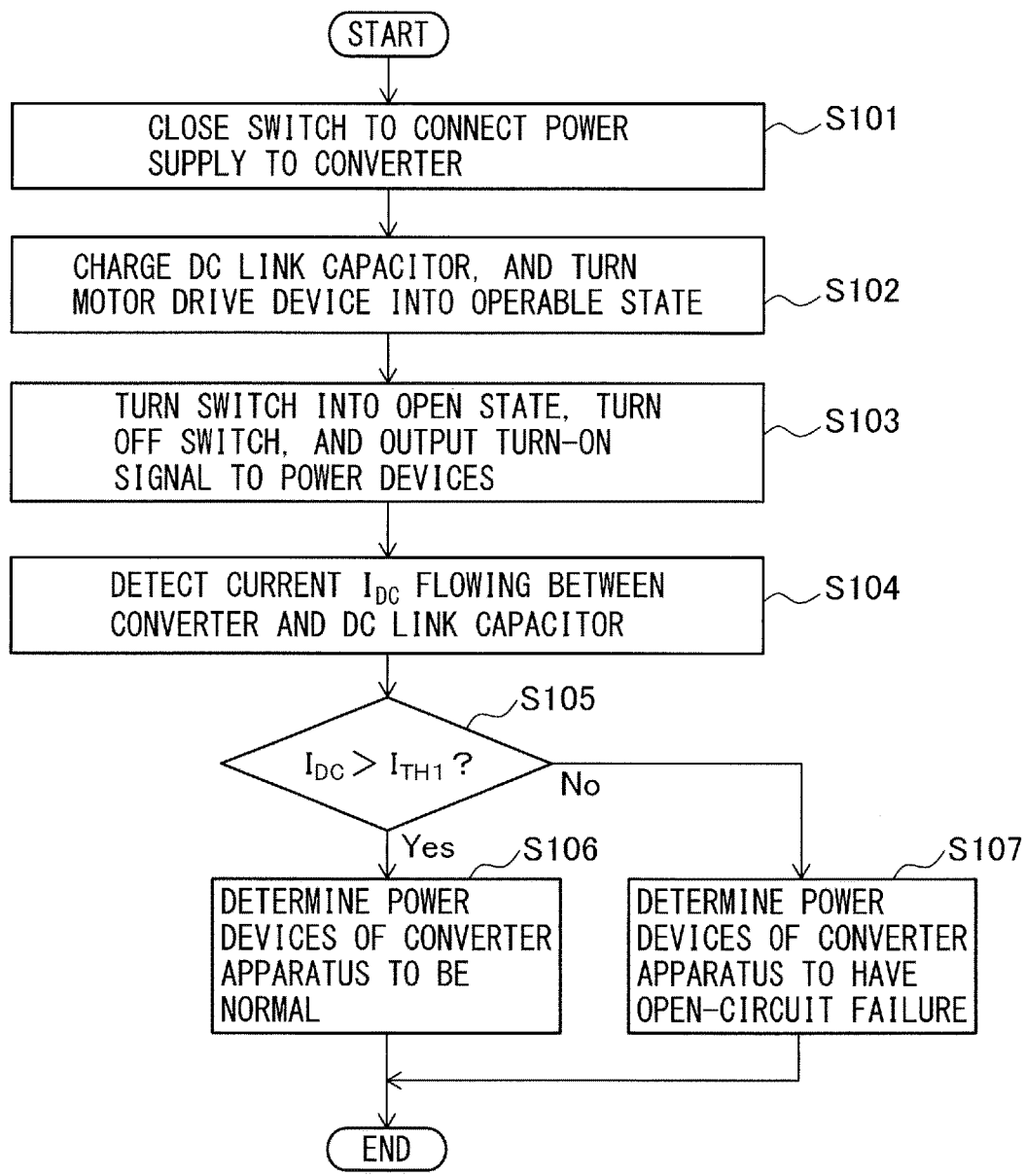
FIG. 3 is a flowchart of an open-circuit failure detection process by a method for detecting a failure of the converter apparatus according to the embodiment.

Next, a method for detecting an open-circuit failure of power devices, using the converter apparatus according to this embodiment, will be described. FIG. 3 is a flowchart of a failure detection process by the method for detecting an open-circuit failure of the power devices of the converter apparatus according to the embodiment. In step S101, the power supply monitor 9 closes the switch 8 to connect the power supply 20 to the converter 1. Thus, an AC voltage supplied from the power supply 20 to the converter 1 is converted into a DC voltage, and the DC voltage is outputted Lo the DC link capacitor 2.

Next, in step S102, the DC link capacitor 2 is charged. The DC link capacitor 2 is charged until the voltage across the DC link capacitor 2 becomes equal to the DC voltage outputted from the converter 1. Thereafter, the motor drive device becomes an operable state.

Next, in step S103, the power supply monitor 9 controls the switch 8 so as to turn the switch 8 into an open state. While the switch 42 is turned off, a turn-on signal is outputted to the power devices. More specifically, the turn-on signal is outputted so as to turn on only the upper arm power device and the lower arm power device which are connected to the same phase. Step S103 is preferably performed after a time in which the DC link capacitor 2 is assumed to be sufficiently charged has elapsed since the switch 8 is turned into the closed state in step S101. A case where a command, such as an emergency stop command, is inputted, after the motor drive device, etc., is operated can be given as a concrete example.

Next, in step S104, the current $I_{DC}$ flowing between the converter 1 and the DC link capacitor 2 is detected. While the power supply monitor 9 turns the switch 8 into the open state, the power supply monitor 9 notifies the failure detector 11 of the control by which the switch 8 has been turned into the open state. Upon receiving the notification, the failure detector 11 receives a detection result of the current $I_{DC}$ flowing between the converter 1 and the DC link capacitor 2, from the current detector 6.

Next, in step S105 the failure detector 11 determines whether or not the current $I_{DC}$ flowing between the converter 1 and the DC link capacitor 2 is more than a first threshold value $I_{TH1}$. When $I_{DC}$ is more than the first threshold value $I_{TH1}$, the power devices are determined to have no open-circuit failures. In this case, in step S106, the failure detector 11 therefore determines that the power devices of the converter apparatus 100 operate normally.

Conversely, when $I_{DC}$ is equal to or less than the first threshold value $I_{TH1}$, the power devices are determined to have an open circuit failure. In this case, in step S107, the failure detector 11 therefore determines that the power devices of the converter apparatus 100 have an open-circuit failure.

Next, a method for detecting a short-circuit failure of a power device, using the converter apparatus according to this embodiment, will be described. FIG. 4 is a flowchart of a short-circuit failure detection process by the method for detecting a short-circuit failure of the converter apparatus according to a modification example of this embodiment. Steps S201 and S202 are the same as steps S101 and S102 of the above-described open-circuit failure detection process, respectively. In step S203, a power device of any one of the upper arm and the lower arm of the converter 1 is turned on, immediately after the power supply 20 is disconnected from the converter 1, and the switch 42 is turned off. For example, in FIG. 2, the U-phase upper arm power device $Tr_1$ is turned on, while the other power devices $Tr_2$ to $Tr_6$ are kept in an off state.

In step S204, a current $I_{DC}$ flowing between the converter 1 and the DC link capacitor 2 is detected. The detected current value $I_{DC}$ is sent to the failure detector 11.

Next, in step S205, whether or not the current $I_{DC}$ is less than a second threshold value $I_{DC}$ is detected. When the current $I_{DC}$ is equal to or more than the second threshold value $I_{TH2}$, the power device of the converter apparatus 100 is determined to have a short-circuit failure in step S206.

Conversely, when the current is less than the second threshold value $I_{TH2}$, the power device of the converter apparatus 100 is determined to be normal.

As described above, the method for detecting a failure according to the modification example of this embodiment can detect the presence or absence of a short-circuit failure of the power device for one of the upper arm and the lower arm of the converter, in accordance with a current flowing upon turning on the power device of the other of the upper arm power device and the lower arm power device.

The converter apparatus having the function of detecting a failure of the power device and the method for detecting the failure of the power device according to the embodiment of this disclosure allow for the detection of the presence or absence of an abnormality in the power devices of the converter apparatus.

What is claimed is:

1. A converter apparatus comprising:
a converter including a plurality of power devices, configured to convert an AC voltage supplied from a power supply into a DC voltage, and output the DC voltage;
a DC link capacitor connected to an output side of the converter;
a voltage detector configured to detect a voltage of the DC link capacitor;
a charging circuit disposed between the converter and the DC link capacitor, configured to charge the DC link capacitor;
a charging circuit controller configured to control a charging switch connected in parallel with a charging resistor in the charging circuit;
a current detector configured to detect a current flowing between the converter and the DC link capacitor;
a turn-on controller configured to control turning-on of the power devices of the converter;
a power switch configured to connect or disconnect between the power supply and the converter;
a power supply monitor configured to control switching of the power switch, and to monitor a connection state between the power supply and the converter by detecting a voltage to be inputted to the converter;
a threshold value setter configured to set a first threshold value or a second threshold value to determine a presence or an absence of a failure of the power devices; and
a failure detector configured to determine the presence or absence of the failure of the power devices by a comparison between the first threshold value or the second threshold value and a current flowing upon turning on at least one power device of the converter using electric charge of the DC link capacitor, immediately after the power switch disconnects the power supply from the converter and the charging switch is turned off.

2. The converter apparatus according to claim 1, wherein when the turn-on controller turns on the at least one power device, the charging circuit controller controls the charging circuit such that an excessive current does not flow through the at least one power device.

3. The converter apparatus according to claim 1, wherein the failure detector compares a current flowing upon concurrently turning on the power devices for an upper arm and a lower arm which are connected to the same phase of the converter with the first threshold value in order to detect the presence or absence of an open-circuit failure of the power devices for the upper arm and the lower arm.

4. The converter apparatus according to claim 1, wherein the failure detector compares a current flowing upon turning on a power device for any one of an upper arm and a lower arm of the converter with the second threshold value in order to detect the presence or absence of a short-circuit failure of the power device for the other of the upper arm and the lower arm.

5. The converter apparatus according to claim 1, wherein the threshold value setter can rewrite the first threshold value or the second threshold value based on a signal inputted from outside.

6. A method for detecting a failure of a power device of a converter apparatus including:
a converter including a plurality of power devices, configured to convert an AC voltage supplied from a power supply into a DC voltage, and output the DC voltage;
a DC link capacitor connected to an output side of the converter;
a charging switch connected in parallel with a charging resistor and connected to the DC link capacitor;
a current detector configured to detect a current flowing between the converter and the DC link capacitor; and
a power switch configured to connect or disconnect between the power supply and the converter,
the method comprising:
connecting the power supply to the converter by closing the power switch;
charging the DC link capacitor;
controlling the power switch so as to turn the power switch into an open state, to disconnect the power supply from the converter;
detecting a current flowing between the converter and the DC link capacitor, immediately after the power supply is disconnected from the converter; and
determining a presence or an absence of a failure of the power devices by:
turning off the charging switch after the power switch is turned off to supply the electric charge from the DC link capacitor to the converter,
turning on at least one of the power devices of the converter, and
comparing current flowing through the converter to:
a first threshold value to determine the presence or absence of an open-circuit failure of the power devices, or
a second threshold value to determine the presence or absence of an short-circuit failure of the power devices.

7. The method for detecting the failure of the power device according to claim 6, wherein when the power device is turned on, a charging circuit disposed between the converter and the DC link capacitor, for charging the DC link capacitor, is controlled so that an excessive current does not flow through the power device.

8. The method for detecting the failure of the power device according to claim 6, wherein a current flowing upon concurrently turning on the power devices for an upper arm and a lower arm which are connected to the same phase of the converter is compared with the first threshold value, in order to detect the presence or absence of the open circuit failure of the power devices for the upper arm and the lower arm.

9. The method for detecting the failure of the power device according to claim 6, wherein a current flowing upon turning on the power device for any one of an upper arm and a lower arm of the converter is compared with the second threshold value, in order to detect the presence or absence of the short-circuit failure of the power device for the other of the upper arm and the lower arm.

10. The method for detecting the failure of the power device according to claim 6, wherein a threshold value setter can rewrite the first threshold value or the second threshold value based on a signal inputted from outside.

* * * * *